United States Patent
Tramet et al.

(10) Patent No.: US 9,648,769 B2
(45) Date of Patent: May 9, 2017

(54) POWER UNIT FOR ELECTRIC VEHICLE INVERTER

(75) Inventors: Guillaume Tramet, Montesson (FR); Roger Deniot, Poissy (FR); Benjamin Morliere, Osny (FR); Fabrice Herault, Flins sur Seine (FR)

(73) Assignee: Valeo Systemes de Controle Moteur, Cergy Saint Christophe (FR)

( * ) Notice: Subject to any disclaimer, the term of this patent is extended or adjusted under 35 U.S.C. 154(b) by 24 days.

(21) Appl. No.: 14/238,663

(22) PCT Filed: Jul. 25, 2012

(86) PCT No.: PCT/FR2012/051766
§ 371 (c)(1),
(2), (4) Date: Feb. 12, 2014

(87) PCT Pub. No.: WO2013/026969
PCT Pub. Date: Feb. 28, 2013

(65) Prior Publication Data
US 2014/0192496 A1 Jul. 10, 2014

(30) Foreign Application Priority Data

Aug. 19, 2011 (FR) ..................... 11 57417

(51) Int. Cl.
*H05K 7/02* (2006.01)
*H05K 7/14* (2006.01)
(Continued)

(52) U.S. Cl.
CPC .......... *H05K 7/026* (2013.01); *B60L 11/1811* (2013.01); *H05K 1/18* (2013.01); *H05K 7/1432* (2013.01); *H02M 7/003* (2013.01)

(58) Field of Classification Search
CPC ........ H05K 1/18; H05K 7/026; H05K 7/1432; H01L 23/053; H01L 25/162;
(Continued)

(56) References Cited

U.S. PATENT DOCUMENTS 5,235,494 A * 8/1993 Chang et al. ................. 361/736
5,657,203 A * 8/1997 Hirao et al. .................. 361/707
(Continued)

FOREIGN PATENT DOCUMENTS

DE 101 61 016 A1 7/2003
EP 2 328 265 A1 6/2011
(Continued)

OTHER PUBLICATIONS

International Search Report for corresponding International Application No. PCT/FR2012/051766, mailed Oct. 22, 2012 (6 pages).

*Primary Examiner* — Courtney Smith
*Assistant Examiner* — Sagar Shrestha
(74) *Attorney, Agent, or Firm* — Osha Liang LLP

(57) ABSTRACT

The invention relates to a power unit having a housing (1) in which at least one power electronics module (2), preferably a plurality of power electronics modules (2) is or are housed, positioned on a plane of the housing (1), the or each power electronics module (2) comprising at least one power electronics component (16), and being connected to at least one electronic control board (6) by at least one connection element (5). The power unit is characterized in that it comprises at least one member (7, 8) supporting the at least one electronic control board facing the power module (2) over at least one expanse of the board (6), the support member being the beam (7, 8) substantially parallel to said plane of the housing.

12 Claims, 3 Drawing Sheets

(51) Int. Cl.
*B60L 11/18* (2006.01)
*H05K 1/18* (2006.01)
*H02M 7/00* (2006.01)

(58) Field of Classification Search
CPC ... H01L 2924/1305; H01L 2924/13055; H01L 2924/13091; H01L 2224/49175; H01L 2224/48091; H01L 2924/00014; H01L 2924/00; H02M 7/003; B60L 11/1811

USPC ....... 361/600, 709, 710, 713, 715, 728, 729, 361/730, 748, 752, 753, 790, 797, 760, 361/772, 773, 800; 257/690, 691, 692, 257/777, 778; 174/50, 109, 172, 179, 174/183, 184, 362, 368, 504, 520, 535, 174/537, 559, 565

See application file for complete search history.

(56) References Cited

U.S. PATENT DOCUMENTS

| | | | |
|---|---|---|---|
| 6,144,571 A * | 11/2000 | Sasaki | H01L 25/162 257/687 |
| 6,147,869 A | 11/2000 | Furnival | |
| 6,384,331 B1 * | 5/2002 | Ku | 174/548 |
| 6,501,662 B2 * | 12/2002 | Ikeda | 361/760 |
| 7,209,367 B2 * | 4/2007 | Nakano | H05K 3/3405 361/775 |
| 8,619,434 B2 * | 12/2013 | Biester et al. | 361/807 |
| 8,654,500 B2 * | 2/2014 | Satake | 361/218 |
| 2003/0106924 A1 * | 6/2003 | Nobori et al. | 228/180.22 |
| 2007/0284947 A1 * | 12/2007 | Lee et al. | 307/31 |
| 2012/0043943 A1 * | 2/2012 | Dyer et al. | 320/137 |
| 2012/0175755 A1 * | 7/2012 | Bayerer | H01L 24/05 257/675 |
| 2012/0257354 A1 * | 10/2012 | Dede | 361/703 |

FOREIGN PATENT DOCUMENTS

| | | |
|---|---|---|
| FR | 2 833 802 A1 | 6/2003 |
| FR | 2 871 022 A1 | 12/2005 |
| FR | 2 914 531 A1 | 10/2008 |

* cited by examiner

POWER UNIT FOR ELECTRIC VEHICLE INVERTER

The present invention relates to a power unit, notably for an inverter, particularly mounted at the terminals of a high-voltage battery of an electric vehicle, which comprises at least one power electronics module, preferably a plurality of power modules, connected to at least one electronic control board.

Power modules intended to form part of such a power unit, notably "Insulated Molded Leadframe" or IML modules are already known from the prior art, from French patent 0116153 in the name of the applicant company. The electronic control board is typically a printed circuit board or PCB. The power module and the electronic control board are electrically connected so that the functions of the power unit can be performed. Typically, the module and the board are housed in a housing of the power unit.

Typically, the electrical connectors between the power module and the electronic control board are soldered to the board by a wave soldering process known per se. However, this is a process that is difficult to carry out. The problem is that the assembly consisting of the power module and the electronic control board has to be turned over to be brought into contact with a source of solder known as a wave. Furthermore, the quality of the soldering is difficult to achieve because of the poor adhesion of the solder to a surface. Now, poor quality soldering reduces the life of the electrical connection, and this is particularly detrimental notably in the context of electric vehicle development.

Other soldering methods such as reflow soldering or ultrasonic soldering are also known. In these methods it is necessary to hold the electronic board during the soldering process.

For that purpose, the power unit may comprise vertical studs rising up from the bottom of the housing to support the board. However, the board lacks rigidity between the studs, and this has the effect of detracting from the good quality soldering of the electrical connections between the board and the power electronics module, particularly in the case of ultrasonic soldering.

A power unit that allows the electronic control board to be held firmly in position is therefore sought.

The invention proposes a power unit having a housing in which at least one power electronics module, preferably a plurality of power modules is or are housed, the or each power electronics module comprising at least one power electronics component, and being connected to at least one electronic control board by at least one connection element, characterized in that it comprises at least one member supporting the at least one electronic control board facing the power module over at least one expanse of the board. For example, the support member is a beam or a plane.

Hitherto, the power unit has been somewhat unreliable. The inventors have realized that that was caused by the poor electrical connection between the power modules and the electronic control board, and notably due to the difficulty in soldering the electrical connection elements to the board. The member that supports the electronic board supports the board over at least one expanse of the board. In the context of the present patent application, an expanse means a dimension of the board, such as a width, a length or a diagonal of the board for example. Thus, as the board is supported along at least one of its dimensions, the board is held firmly in position by the support member. Pressure can be applied to the board in order to connect the connection elements to the electronic board without causing a deformation that would detract from the quality of the electric connection. In particular, the support member allows the board to be held firmly, during soldering, or when electrical connection elements are being forcibly engaged. The support member holds the board facing the power module, particularly over the power module.

The power module comprises one or more power electronics components which receive high power electrical signals. In the context of the present application, a power electronics component means a component on its own or a collection of subcomponents. The electronics component is able to transmit an electrical signal with a power of between for example 40 and 100 kW. The electronic control board comprises components that receive low power signals. In particular, the electronic control board controls the electronics of the power module.

For preference, the connection element is soldered to the control board ultrasonically, and this is highly advantageous because this type of soldering can be performed at high speed.

According to one preferred embodiment of the invention, the connection element connecting the at least one power module and the at least one electronic control board consists of at least one electrical bonding wire that provides electrical connection.

According to one preferred embodiment of the invention, the connection element is a pin electrically connected to the power module and to the electronic control board. For example, electrical connection of the board is performed partly by forcibly inserting the pin into an opening in the board.

According to one preferred embodiment of the invention, the power module is positioned on a plane of the housing. The support member extends at least in a plane, notably in a plane substantially parallel to the plane of the above housing. In particular, the support member is a support beam substantially parallel to said plane of the housing. The plane of the housing is notably a bottom of the housing.

According to one preferred embodiment of the invention, the support member is fixed to the housing of the power unit.

In particular, the support member is supported by one or more lateral walls of the housing.

According to one preferred embodiment of the invention, the electronic control board is fixed to the support member by at least one fixing, preferably a fixing screw. The fixing may be any element that allows the electronic control board and the support member to be secured to one another mechanically.

For preference, the power unit comprises at least one fixing facing the power module. In particular, the power unit comprises two fixings facing the power module. In one particular example, the connection element connects the board between said two fixings.

For example, two fixing screws are provided facing each module and a zone for soldering electrical bonding wires of one module is defined by the region of the board which lies above the beam between the two screws associated with said module.

Providing at least one fixing facing each module, and notably two fixings facing each module in this way makes for excellent rigidity of the surface of the board on which the connecting elements are electrically connected. In particular, this keeps the electronic control board rigid while electrical connection elements are being ultrasonically soldered to the electronic control board.

According to one preferred embodiment of the invention, the support member comprises a rigid first material extending in the support member. The first material keeps the electronic board held firmly. The rigid first material is notably a metal.

In an alternative form of this embodiment, an electrically insulating second material covers at least part of said rigid first material. In particular, the insulating second material is located at least between the first material and the electric control board. In particular, the insulating second material coats the first material. The second material improves the electrical insulation of the electronic control board with respect to the support member. In particular, the electrically insulating second material is a plastic.

In particular, the second material is overmolded onto the first material of the support member.

According to one preferred embodiment of the invention, the fixing enters a hole formed in the first material of the support member, the hole being filled with the electrically insulating second material.

According to one preferred embodiment of the invention, the deflection of the support member is less than 0.1 mm when the support member is subjected to a transverse loading or even to a stress in a substantially orthogonal direction, of between 1 and 2 kg notably of substantially 1.5 kg and is subjected to ultrasound at a frequency between 50 and 100 kHz, notably of substantially 80 kHz. Thus, the electrical connection elements can be connected to the electronic control board by ultrasonic soldering.

The present invention also relates to an inverter, notably for an electric vehicle, comprising a power unit according to the invention.

The present invention also relates to an electric vehicle comprising a power unit according to the invention, connected to a high-voltage battery of the electric vehicle so that the battery can be recharged from an electrical mains outlet.

The invention also relates to a power unit having a housing in which at least one power electronics module, preferably a plurality of power modules is or are housed, positioned on a plane of the housing, the or each power electronics module comprising at least one power electronics component, and being connected to at least one electronic control board by at least one connection element, characterized in that it comprises at least one member supporting the at least one electronic control board facing the power module over at least one expanse of the board, the support member being a beam substantially parallel to said plane of the housing.

Some embodiments of the invention are now described by way of example with reference to the drawings in which:

FIGS. 1 to 4 depict examples of power units according to the invention comprising a housing 1 of substantially parallelepipedal shape.

Figure 1:
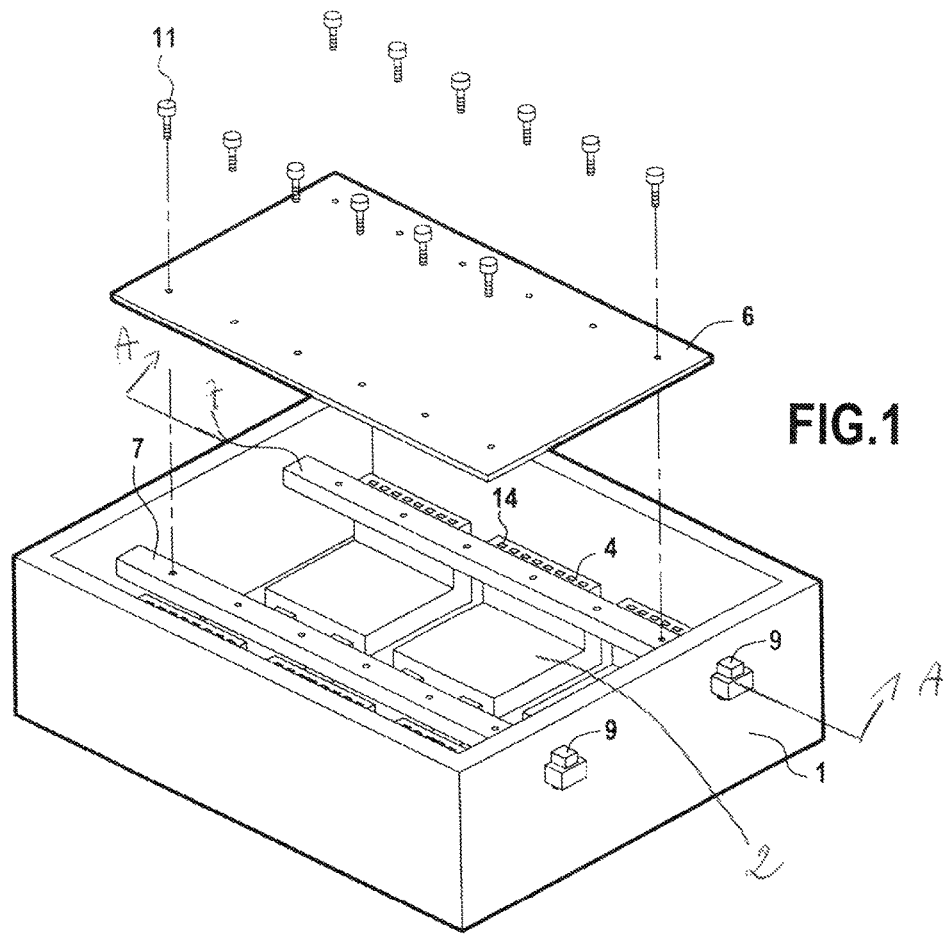
FIG. 1 is an exploded perspective view from above of a power unit according to one embodiment of the invention, the electronic control board being depicted in the state in which it is not fixed to the support members.

The housing 1 houses one or more power modules 2. In the example illustrated in FIG. 1, the housing 1 houses six power electronics modules 2 which are arranged in two rows of three modules. An electronic control board 6 extends facing the modules 2.

Figure 2:
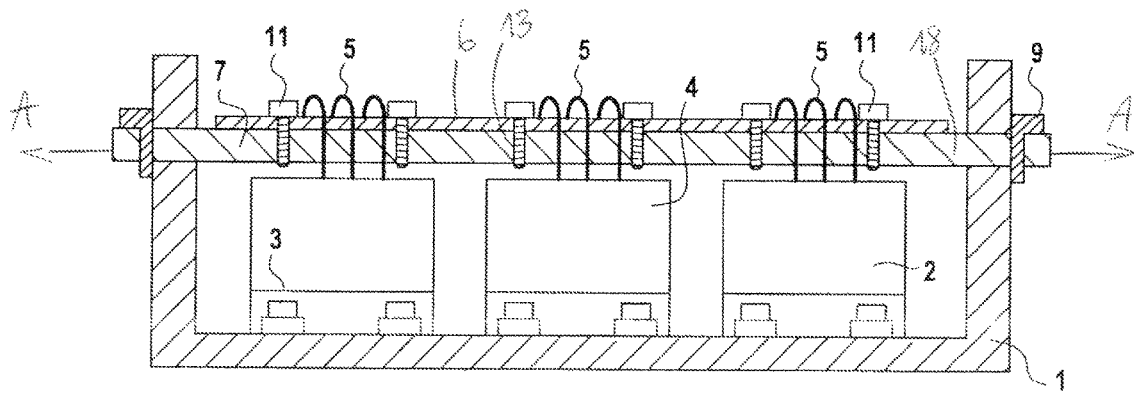
FIG. 2 is a view in section on AA of FIG. 1; the electronic board being fixed to the support members and connected to the power modules.

The electronic control board 6 extends facing the modules being connected to them by electrical connection elements such as electrical bonding wires 5 (FIG. 2). The electronic control board is, for example, a PCB or printed circuit board which is arranged above the power modules 2.

The electronic control board 6 is supported by two support beams 7, 8 extending on either side of the housing 1. The beams 7, 8, have a cross section that is square in shape, but could also have another shape. The support members, in this instance the support beams 7, 8, are fixed to the casting of the housing 1 by a fixing such as a screw 9.

The support beams 7, 8 comprises a rigid first material 18 which extends in the support beams 7, 8. The rigid first material is, for example, a metal such as steel or aluminum for example. For example, the support beam 7 consists of the first material 18 as illustrated in FIG. 2. The support beam 8 may further comprise an electrically insulating second material 19. The insulating second material 19 covers at least part of the first material 18, thus improving the electrical insulation of the electronic control board 6 with respect to the support beam 8. For example, the second material 19 is a plastic overmolded onto the first material 18.

Figure 3:
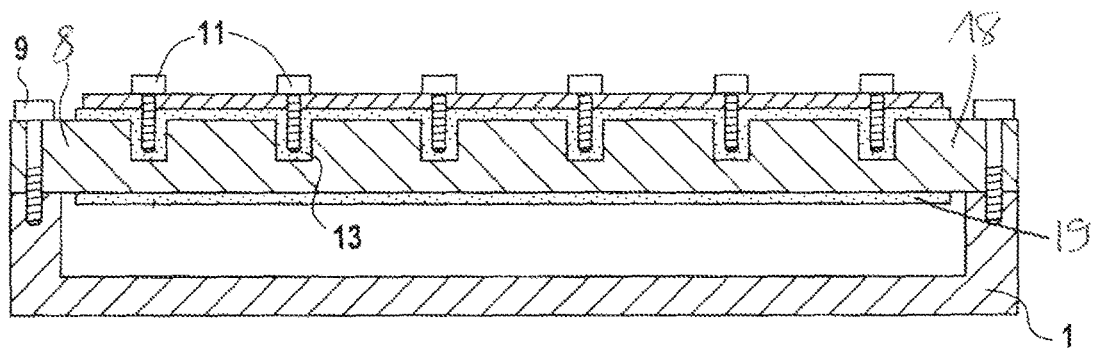
FIG. 3 is a view in section of a power unit according to one embodiment of the invention, in which the power modules are not depicted.

The electronic control board 6 can be fixed to each beam 7, 8 by a series of fixing screws 11. For preference, each fixing screw 11 enters a respective hole 13 formed in the support beam 7, 8. Notably, as illustrated in FIG. 2, each screw 11 can enter a hole 13 formed in the first material 18. The hole 13 may also be filled with the electrically insulating second material 19 as illustrated in FIG. 3. In this way the electrical insulation of the electronic control board 6 is improved.

Figure 4:
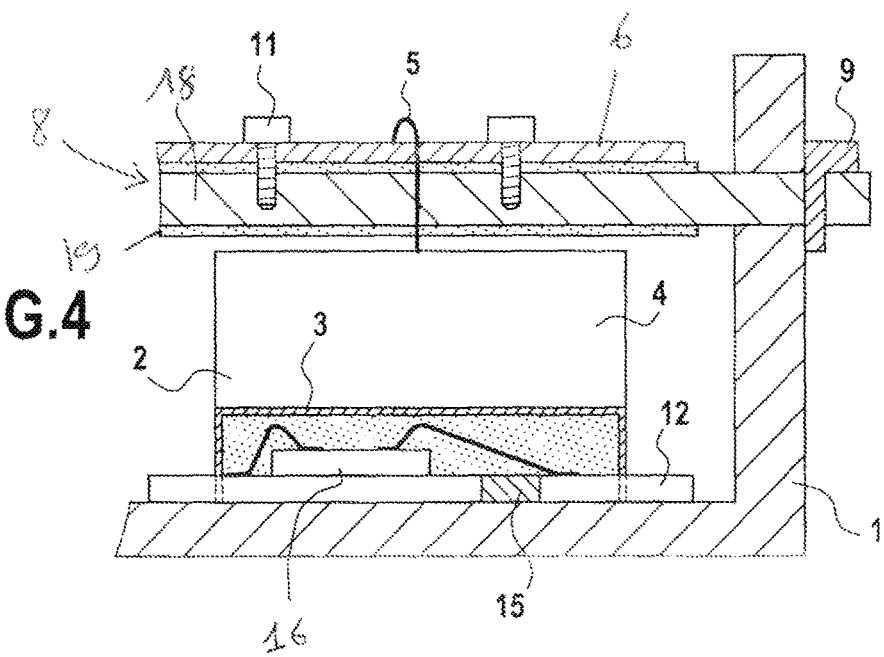
FIG. 4 is another view in section of part of a power unit according to one embodiment of the invention.

For preference, there are two fixing screws 11 delimiting between them a zone of the support beam 7, 8 and a corresponding zone of the board 6 over each of the modules 2 (as illustrated in FIGS. 2 and 4). Connected to the zone of the board 6 are connection elements 5 provided for electrically connecting the card 6 and each module 2 together. The connection elements are, for example, electrical bonding wires 5, as illustrated in FIGS. 2 and 4, soldered to the board 6 ultrasonically for example.

In particular, the two respective screws 11 above each module 2 may be a distance apart that corresponds more or less to the dimension of each module 2 in the direction in which the beams 7, 8 extend. For example, the fixing screws 11 are spaced apart by the width of the module 2. By thus providing these two fixing screws 11 arranged substantially a distance apart that corresponds to the widthwise dimension of each module 2, the corresponding zone of the board 6 is given a degree of rigidity between the two screws 11 which is particularly well suited to allowing the wires 5 to be ultrasonically soldered while at the same time allowing a plurality of electrical connections in the zone of the board. Thus, several electrical bonding wires 5 are fixed to the electronic control board 6 by ultrasonic soldering in a way that is reliable, particularly in the zone delimited between the two screws 11 associated with a given module 2.

Figure 6:
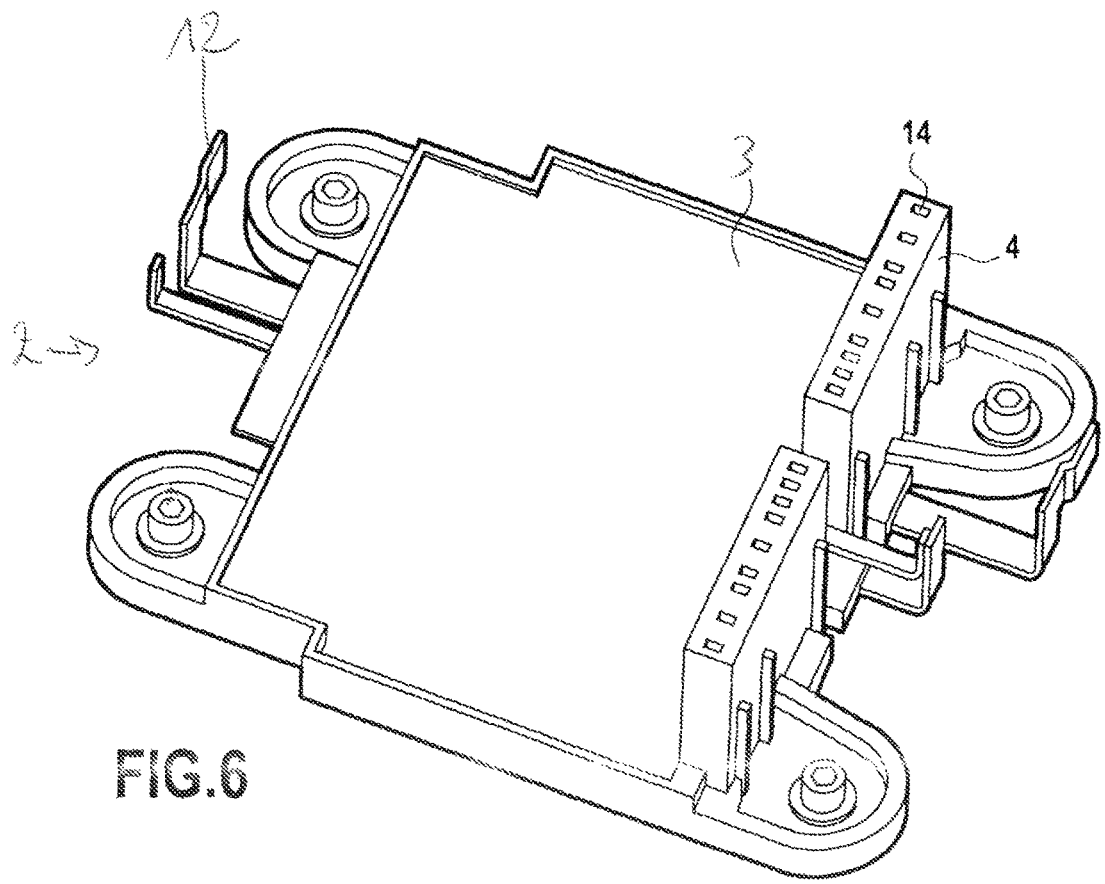
FIG. 6 is a perspective view of a module of a power unit according to one embodiment of the invention.

FIG. 6 depicts one example of a module 2. This module 2 may notably be an IML module as described in French patent 0116153 in the name of the applicant company.

For example, the module 2 comprises a casing 3 in which conductive strips 12 are housed, for example made of copper, on which power electronics components 16 are mounted (FIG. 4).

The components 16 may be mounted, notably brazed or soldered, onto the conducting strips 12. The components 16 may, for example, be a bipolar component such as a diode, a tripolar component such as a MOS or IGBT type transistor or a more complex component such as an integrated circuit of ASIC or similar type.

For preference, the module 2 comprises a connector 4 allowing the components 16 of the module 2 to be electrically connected to control signals, notably to the electronic control board 6.

For example, the connector is a connecting stud 4 protruding from the upper face of the casing 3 and comprising connection points 14, for example for connection to the electronic 6 control board 6.

For preference, the conducting strips 12 project on either side of the modules 2 for connection to a power network and/or to the other modules. The conducting strips 12 are separated from one another by an insulating dielectric material 15.

For example, the interior space inside the casing 3 is filled with a gel, such as silicone, to protect the power components 16. In place of the gel it is possible to envision other similar materials, for example a resin of the epoxy type.

Figure 5:
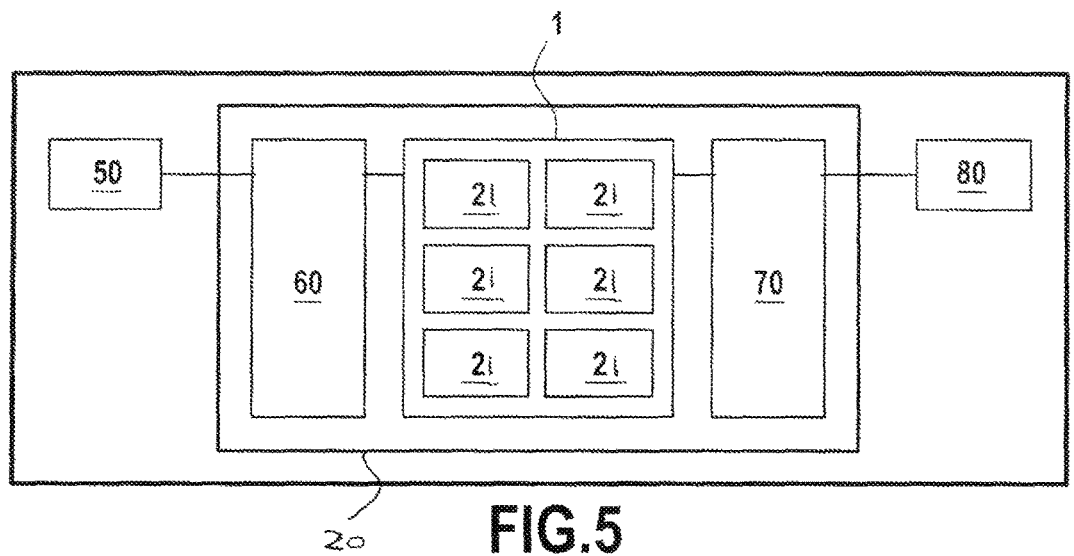
FIG. 5 is a block diagram of an electric vehicle comprising an inverter comprising a power unit according to one embodiment of the invention.

As depicted in FIG. 5, the power electronics unit 21 may, with two filtering units 60, 70, form part of an inverter 20 intended to be placed between a high-voltage battery 50 of an electric vehicle and a mains power outlet 80 for recharging the battery 50.

In particular, the power unit 21 may have a length of 30 cm and a width of 25 cm and each module 2 has a length and width of 10 cm.

The invention claimed is:

1. A power unit comprising:
 a housing in which at least one power electronics module is housed, positioned on a plane of the housing, the power electronics module comprises a module housing and at least one power electronics component, and is directly connected to at least one electronic control board by at least one connection element, said connection element being formed by an electrical bonding wire that is ultrasonically soldered to the control board; and
 at least one support member that supports the at least one electronic control board facing the power module over at least one expanse of the board,
 wherein the support member and the housing of the power unit are distinct,
 wherein the support member being a beam inserted in said housing and substantially parallel to said plane of the housing, and
 wherein the electronic control board is fixed to the support member by two distinct fixings facing the power module according to a direction perpendicular to the plane of the housing on which the power electronics module is positioned, said electrical bonding wire connects the board between said two fixings.

2. The power unit as claimed in claim 1, wherein the support member is fixed to the housing of the power unit.

3. The power unit as claimed in claim 2, wherein the support member is supported by one or more lateral walls of the housing.

4. The power unit as claimed in claim 1, wherein the support member comprises a rigid first material extending in the support member.

5. The power unit as claimed in claim 4, wherein an electrically insulating second material covers at least one part of said rigid first material.

6. The power unit as claimed in claim 5, wherein the second material is overmolded onto the first material.

7. The power unit as claimed in claim 5, wherein the fixing enters a hole formed in the first material of the support member, the hole being filled with the electrically insulating second material.

8. The power unit as claimed in claim 1, wherein the deflection of the support member is less than 0.1 mm when the support member is subjected to a transverse loading of between 1 and 2 kg and is subjected to ultrasound at between 50 and 100 kHz.

9. An inverter for an electric vehicle, comprising a power unit as claimed in claim 1.

10. An electric vehicle comprising a power unit as claimed in claim 1, connected to a high-voltage battery of the electric vehicle so that the battery can be recharged from an electrical mains outlet.

11. The power unit as claimed in claim 1, wherein the support member is suspended in the housing.

12. The power unit as claimed in claim 1, wherein the power electronics module and the at least one electronic control board are inserted in the housing through a same opening of the housing.

* * * * *